US011238922B2

(12) United States Patent
Lai et al.

(10) Patent No.: US 11,238,922 B2
(45) Date of Patent: Feb. 1, 2022

(54) CIRCUIT STRUCTURE FOR IN-MEMORY COMPUTING

(71) Applicant: Shanghai Huali Integrated Circuit Mfg. Co., Ltd., Shanghai (CN)

(72) Inventors: Zhen'an Lai, Shanghai (CN); Juncheng Chen, Shanghai (CN); Zhaoying Huang, Shanghai (CN)

(73) Assignee: Shanghai Huali Integrated Circuit Mfg. Co. Ltd., Shanghai (CN)

( * ) Notice: Subject to any disclaimer, the term of this patent is extended or adjusted under 35 U.S.C. 154(b) by 0 days.

(21) Appl. No.: 17/096,958

(22) Filed: Nov. 13, 2020

(65) Prior Publication Data

US 2021/0304815 A1 Sep. 30, 2021

(30) Foreign Application Priority Data

Mar. 26, 2020 (CN) ........................ 202010224134.7

(51) Int. Cl.

*G11C 11/412* (2006.01)
*G11C 11/419* (2006.01)
*H01L 27/11* (2006.01)

(52) U.S. Cl.

CPC .......... *G11C 11/412* (2013.01); *G11C 11/419* (2013.01); *H01L 27/1104* (2013.01); *H01L 27/1116* (2013.01)

(58) Field of Classification Search

CPC ..... G11C 11/412; G11C 11/419; G11C 5/025; G11C 5/063; H01L 27/1104; H01L 27/1116

USPC ................................................ 365/154, 205

See application file for complete search history.

(56) References Cited

U.S. PATENT DOCUMENTS 6,111,780 A * 8/2000 Bertin ................ H01L 27/1104 257/E27.099
9,208,853 B2 * 12/2015 Kolar .................... G11C 11/412
9,870,818 B1 * 1/2018 Garg ..................... G11C 11/418
2009/0303820 A1 * 12/2009 Arsovski ................. G11C 8/16 365/203
2014/0104960 A1 * 4/2014 Iyer ......................... G11C 7/12 365/189.05
2019/0370640 A1 * 12/2019 Peng .................... G06N 3/0635
2020/0135266 A1 * 4/2020 Kumar .................. G11C 11/412
2020/0286548 A1 * 9/2020 Frederick, Jr. ........... G11C 7/12
2021/0035986 A1 * 2/2021 Yu ....................... H01L 27/1104
2021/0118477 A1 * 4/2021 Bringivijayaraghavan ................ G11C 7/222

* cited by examiner

*Primary Examiner* — Michael T Tran
(74) *Attorney, Agent, or Firm* — Adsero IP

(57) ABSTRACT

The present disclosure relates to a circuit structure for in-memory computing. The circuit structure comprises a plurality of 8T SRAMs, four BLs, two WLs, and a direction configuration circuit. Each of the 8T SRAMs comprises two groups of read/write dual ports, two WL ports and two direction configuration ports. Data of first read/write port and second read/write port of each group of the read/write dual ports are inverse of each other. Each of the BLs is connected to a corresponding processor, and is connected to a read/write port of a corresponding read/write dual port of each 8T SRAM in a row direction or a column direction. Each of the WLs is connected to a corresponding processor and connected to a corresponding WL port of each 8T SRAM.

10 Claims, 4 Drawing Sheets

WL_A
CPU_A
VDD
PGA2
PU2
PU1
PGA1
BLb_A
Q̄
Q
BL_A
BLb_b
BL_b
PGB2
PD2
PD1
PGB1
VSS
WL_B
CPU-B

CIRCUIT STRUCTURE FOR IN-MEMORY COMPUTING

CROSS-REFERENCE TO RELATED APPLICATIONS

The present application claims priority to Chinese Patent Application No. 202010224134.7, filed on Mar. 26, 2020, the content of which is incorporated herein by reference in its entirety.

FIELD

The present disclosure relates to the field of memory circuit and cell array design, and discloses an in-memory computing (IMC) circuit structure based on eight-transistor static random access memory (8T SRAM).

BACKGROUND

In the field of memory circuit and cell array design, the prior art generally uses 8T 2-port SRAM or special 6T single port SRAM for achieving IMC. However, both 8T 2P-SRAM and special 6T SP-SRAM mentioned above have disadvantages of requiring complicated design and unable to provide parallel IMC. In particular, the special 6T SP-SRAM mentioned above further has disadvantage of requiring a special process.

Please refer to FIG. 1, which shows a schematic diagram of the structure of a special 6T SP-SRAM. As shown in FIG. 1, special processes such as a Vt setting layer and a shielding layer are further required in the manufacturing process of the special 6T SP-SRAM, which increases the difficulty of the manufacturing process of the SRAM.

Therefore, in order to overcome the above-mentioned shortcomings in the prior art, there is an urgent need in the art for an IMC architecture for simplifying the manufacturing process and the design of IMC devices, and providing parallel in-memory computing functions.

SUMMARY

A brief overview of one or more aspects is provided below to provide a basic understanding of these aspects. The summary is not an extensive overview of all of the aspects that are contemplated, and is not intended to identify key or decisive elements in all aspects. The sole purpose of the summary is to present some concepts of one or more aspects in a simplified form as a prelude to the more detailed description that is presented later.

In order to overcome the above-mentioned shortcomings in the prior art, the present disclosure provides an in-memory computing (IMC) circuit structure based on eight-transistor static random access memory (8T SRAM) for simplifying the manufacturing process and the design of IMC devices, and providing parallel IMC functions.

The above-mentioned circuit structure for IMC provided by the present disclosure comprises a plurality of 8T SRAMs, four bit lines, two word lines, and a direction configuration circuit.

Each of the 8T SRAMs comprises two groups of read/write dual ports, two word line ports and two direction configuration ports. Data of first read/write port and second read/write port of each group of the read/write dual ports are inverse of each other.

The first bit line is connected to a first processor, and is connected to the first read/write port of the first group of read/write dual ports of each 8T SRAM in a row direction. The second bit line is connected to the second read/write port of the first group of read/write dual ports of each 8T SRAM in the row direction. The third bit line is connected to a second processor, and is connected to the first read/write port of the second group of read/write dual ports of each 8T SRAM. The fourth bit line is connected to the second read/write port of the second group of read/write dual ports of each 8T SRAM in the row direction.

The first word line is connected to the first processor, and is connected to the first word line port of each 8T SRAM. The second word line is connected to the second processor, and is connected to the second word line port of each 8T SRAM.

The direction configuration circuit is connected to each direction configuration ports of each 8T SRAM, configured to activate any one of the direction configuration ports of each 8T SRAM to perform a logic operation on the 8T SRAMs in a corresponding direction.

In one embodiment, in some embodiments of the present disclosure, the 8T SRAM may comprise a first gate transistor, a second gate transistor, a third gate transistor, a fourth gate transistor, a first pull-up transistor, a second pull-up transistor, a first pull-down transistor and a second pull-down transistor.

Drain of the first gate transistor may be connected to the first read/write port of the first group of read/write dual ports. Gate of the first gate transistor may be connected to a row direction configuration port. Source of the first gate transistor may be connected to an internal node of the 8T SRAM.

Drain of the second gate transistor may be connected to the second read/write port of the first group of read/write dual ports. Gate of the second gate transistor may be connected to the first word line port. Source of the second gate transistor may be connected to an inverted internal node of the 8T SRAM.

Drain of the third gate transistor may be connected to the first read/write port of the second group of read/write dual ports. Gate of the third gate transistor may be connected to a column direction configuration port. Source of the third gate transistor may be connected to the internal node of the 8T SRAM.

Drain of the fourth gate transistor may be connected to the second read/write port of the second group of read/write dual ports. Gate of the fourth gate transistor may be connected to the second word line port. Source of the fourth gate transistor may be connected to the inverted internal node of the 8T SRAM.

Source of the first pull-up transistor may be connected to a high-level voltage. Drain of the first pull-up transistor may be connected to the internal node. Gate of the first pull-up transistor may be connected to the inverted internal node.

Source of the second pull-up transistor may be connected to the high-level voltage. Drain of the second pull-up transistor may be connected to the inverted internal node. Gate of the second pull-up transistor may be connected to the internal node.

Source of the first pull-down transistor may be connected to a low-level voltage. Drain of the first pull-down transistor may be connected to the internal node. Gate of the first pull-down transistor may be connected to the inverted internal node.

Source of the second pull-down transistor may be connected to the low-level voltage. Drain of the second pull-down transistor may be connected to the inverted internal node. Gate of the second pull-down transistor may be connected to the internal node.

In some embodiments of the present disclosure, the second bit line may be connected to the first processor through a write port of a bidirectional I/O circuit. The fourth bit line may be connected to the second processor through a write port of another bidirectional I/O circuit. In response to a need to perform a write operation on the second bit line or the fourth bit line, the direction configuration circuit may output a low-level voltage to each direction configuration port of each 8T SRAM, a corresponding word line may be connected to a high-level voltage, and the write port of a corresponding bidirectional I/O circuit may be turned on for a corresponding processor to write data to the second bit line or the fourth bit line.

In some embodiments of the present disclosure, the second bit line may be further connected to the first processor through a read port of the bidirectional I/O circuit. The fourth bit line may be further connected to the second processor through a read port of the another bidirectional I/O circuit. In response to a need to perform a read operation on the second bit line or the fourth bit line, the direction configuration circuit may output a low-level voltage to each direction configuration port of each 8T SRAM, a corresponding word line may be connected to a high-level voltage, and the read port of a corresponding bidirectional I/O circuit may be turned on for a corresponding processor to read data from the second bit line or the fourth bit line.

In one embodiment, in some embodiments of the present disclosure, the direction configuration circuit may comprise a row direction enable port, a column direction enable port and a logic operation enable port. The direction configuration circuit may be configured to: in response to high-level signals of the logic operation enable port and the row direction enable port, output a high-level voltage to a row direction configuration port of each 8T SRAM to perform a logic operation on values of the 8T SRAMs that are adjacent in the row direction; or in response to the high-level signals of the logic operation enable port and the column direction enable port, output a high-level voltage to a column direction configuration port of each 8T SRAM to perform a logic operation on values of the 8T SRAMs that are adjacent in the column direction.

In some embodiments of the present disclosure, the first processor may be configured to: in response to a need to perform a NAND logic operation on the values of the 8T SRAMs that are adjacent in the row direction, pre-charge the first bit line to a high level, and output a high-level signal to the logic operation enable port and the row direction enable port; in response to the first bit line remaining in the high level, determine that result of the NAND logic operation is 0; and in response to the first bit line decreasing to a low level, determine that the result of the NAND logic operation is 1.

The second processor may be configured to: in response to a need to perform a NAND logic operation on the values of the 8T SRAMs that are adjacent in the column direction, pre-charge the third bit line to a high level, and output a high-level signal to the logic operation enable port and the column direction enable port; in response to the third bit line remaining in the high level, determine that result of the NAND logic operation is 0; and in response to the third bit line decreasing to a low level, determine that the result of the NAND logic operation is 1.

In one embodiment, in some embodiments of the present disclosure, the row direction configuration port of each 8T SRAM may be grounded through a first transistor. The column direction configuration port of each 8T SRAM may be grounded through a second transistor.

The first processor may be configured to: in response to a need to perform a NOR logic operation on the values of the 8T SRAMs that are adjacent in the row direction, pre-charge the first bit line to a high level, turn on the first transistor to pull down potential of the row direction configuration port, and output a high-level signal to the logic operation enable port and the row direction enable port; in response to the first bit line remaining in the high level, determine that result of the NOR logic operation is 0; and in response to the first bit line decreasing to a low level, determine that the result of the NOR logic operation is 1.

The second processor may be configured to: in response to a need to perform a NOR logic operation on the values of the 8T SRAMs that are adjacent in the column direction, pre-charge the third bit line to a high level, turn on the second transistor to pull down potential of the column direction configuration port, and output a high-level signal to the logic operation enable port and the column direction enable port; in response to the third bit line remaining in the high level, determine that result of the NOR logic operation is 0; and in response to the third bit line decreasing to a low level, determine that the result of the NOR logic operation is 1.

In one embodiment, in some embodiments of the present disclosure, the circuit structure may further comprise two selection modules. The second bit line may be connected to the first processor through the first selection module. The fourth bit line may be connected to the second processor through the second selection module. The two selection modules may be configured to perform a hold-in-place operation, a left shift operation, or a right shift operation on value of each 8T SRAM in response to an input selection signal.

In some embodiments of the present disclosure, each of the selection modules may comprise a plurality of selection units. Number of the selection units may correspond to number of rows of the 8T SRAMs. Each selection unit may comprise one selection port and three input ports. Each of the input ports may correspond to an operation. Bit lines of the 8T SRAMs in each row may be respectively connected to a hold-in-place input port of the selection unit in a same row, a right shift input port of the selection unit in an above row, and a left shift input port of the selection unit in a below row. Each of the selection units of the selection module turns on a corresponding input port to perform the hold-in-place operation, the left shift operation, or the right shift operation according to the selection signal input from the selection port.

In one embodiment, in some embodiments of the present disclosure, the circuit structure may further comprise a transition detection circuit. The transition detection circuit may be configured to output a pulse wave in response to a change in voltage level of an input terminal.

The first processor may be configured to: in response to a need to compare value of the 8T SRAM with external data, use the first bit line as the external data and connect the first bit line to the input terminal of the transition detection circuit; turn on a row direction configuration port of the 8T SRAM; in response to no change in the voltage level output by the transition detection circuit, determine that the value of the 8T SRAM is same as the external data; and in response to the pulse wave output by the transition detection circuit, determine that the value of the 8T SRAM is different from the external data.

The second processor may be configured to: in response to a need to compare value of the 8T SRAM with external data, use the third bit line as the external data and connect the third bit line to the input terminal of the transition detection circuit; turn on a column direction configuration port of the 8T SRAM; in response to no change in the voltage level output by the transition detection circuit, determine that the value of the eight-transistor SRAM is same as the external data; and in response to the pulse wave output by the transition detection circuit, determine that the value of the 8T SRAM is different from the external data.

BRIEF DESCRIPTION OF THE DRAWINGS

The above embodiments of the present disclosure will be better understood after reading the detailed description of the embodiments of the present disclosure in conjunction with the following figures. In the figures, components are not necessarily drawn to scale, and components having similar related features may have the same or similar reference numerals.

DETAILED DESCRIPTION OF EMBODIMENTS

The embodiments of the present disclosure are described in the following detailed description. Although the description of the present disclosure will be described in conjunction with the embodiments, this is not a limitation of the present disclosure. On the contrary, the disclosure is described in connection with the embodiments to cover other alternatives or modifications that are possible in the embodiments of the present disclosure. In order to provide a thorough understanding of the present disclosure, many specific details are included in the following description. The present disclosure may also be practiced without these details. In addition, some specific details are omitted in the description in order to avoid confusing or obscuring the present disclosure.

In the description of the present disclosure, it should be noted that the terms “installation”, “connecting”, and “connected” should be understood broadly unless explicitly stated and defined otherwise. For example, the terms “installation”, “connecting”, and “connected” may be either a fixed connection, a detachable connection, or an integral connection; the terms may be either a mechanical connection or an electrical connection; the terms also may be either a direct connection, an indirect connection through an intermediate medium, or an internal connection between two components.

Understandably, although the terms “first”, “second”, “third”, etc. may be used to describe various components, regions, layers and/or portions to distinguish different components, regions, layers and/or portions, the order of these components, regions, layers and/or portions described above should not be limited by the terms. Therefore, a first component, region, layer and/or portion mentioned below may be also mentioned as a second component, region, layer and/or portion without departing from some embodiments of the present disclosure.

As mentioned above, the prior art generally has the disadvantage of requiring complicated design and special process, and unable to provide parallel in-memory computing (IMC) functions. In order to overcome the above-mentioned shortcomings in the prior art, the present disclosure provides an IMC circuit structure based on eight-transistor static random access memory (8T SRAM) for simplifying the manufacturing process and the design of IMC devices, and providing parallel IMC functions.

Figure 1:
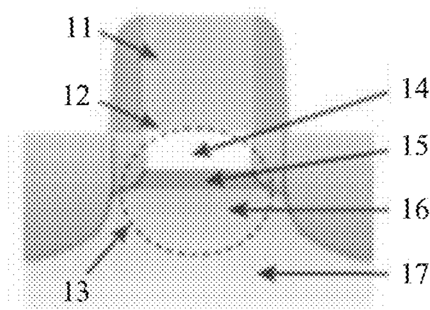
FIG. 1 shows a schematic diagram of the structure of a special 6T SP-SRAM.
Figure 2:
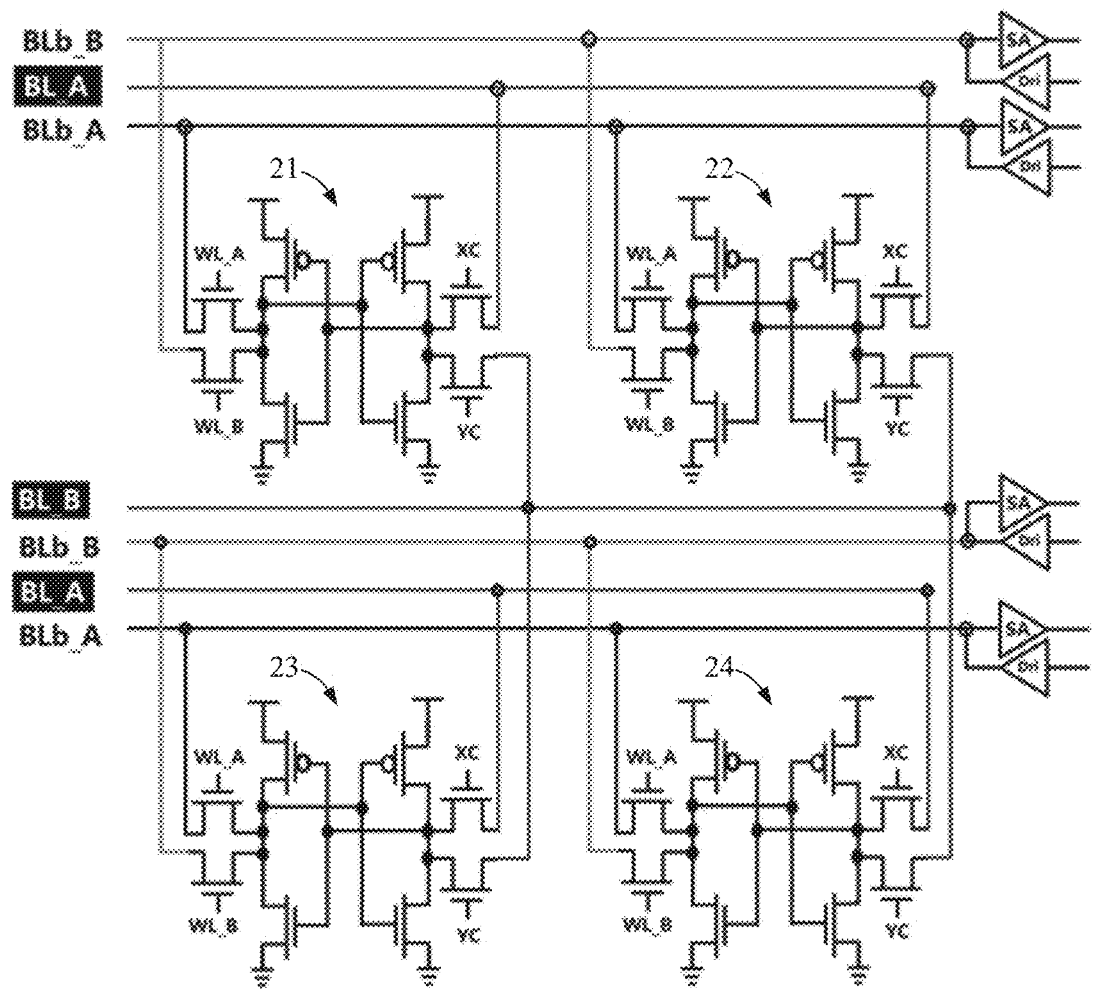
FIG. 2 shows a schematic diagram of a circuit structure for IMC according to some embodiments of the present disclosure.

Referring to FIG. 2, FIG. 2 shows a schematic diagram of a circuit structure for IMC according to some embodiments of the present disclosure.

As shown in FIG. 2, in some embodiments of the present disclosure, the circuit structure for IMC may comprise a plurality of 8T SRAMs 21~24, four bit lines BL_A, BLb_A, BL_B, BLb_B, two word lines WL_A, WL_B, and a direction configuration circuit (not shown).

Each of the 8T SRAMs 21~24 may comprise two groups of read/write dual ports, two word line ports and two direction configuration ports. In one embodiment, the first group of read/write dual ports may comprise a first read/write port connected to the first bit line BL_A, and a second read/write port connected to the second bit line BLb_A. The second group of read/write dual ports may comprise a first read/write port connected to the third bit line BL_B, and a second read/write port connected to the fourth bit line BLb_B. The two word line ports may comprise a first word line port connected to the first word line WL_A, and a second word line port connected to the second word line WL_B. The two direction configuration ports may comprise a row direction configuration port XC and a column direction configuration port YC respectively connected to the direction configuration circuit.

The first bit line BL_A may be connected to the first processor, and is connected to the first read/write port of the first group of read/write dual ports of each of the 8T SRAMs 21~24 in the row direction. The second bit line BLb_A is connected to the second read/write port of the first group of read/write dual ports of each of the 8T SRAMs 21~24 in the row direction. The third bit line BL_B may be connected to the second processor, and is connected to the first read/write port of the second group of read/write dual ports of each of the 8T SRAMs 21~24. The fourth bit line BLb_B is connected to the second read/write port of the second group of read/write dual ports of each of the 8T SRAMs 21~24 in the row direction.

The first word line WL_A may be connected to the first processor, and is connected to the first word line port of each of the 8T SRAMs 21~24. The second word line WL_B may be connected to the second processor, and is connected to the second word line port of each of the 8T SRAMs 21~24.

The direction configuration circuit may comprise two output ports, respectively connected to the row direction configuration port XC and the column direction configuration port YC of each of the 8T SRAMs 21~24, configured to activate the row direction configuration port XC of each of the 8T SRAMs 21~24 to perform logic operations in the row direction of the 8T SRAMs 21~24; or activate the column direction configuration port YC of each of the 8T SRAMs 21~24 to perform logic operations in the column direction of the 8T SRAMs 21~24.

By adopting the IMC circuit structure that directly performs data processing inside a macro of an on-chip memory, the processor can simultaneously activate 8T SRAMs in multiple rows of the memory array, and directly perform logic function operations on the bit lines (BL). Therefore, the IMC circuit structure only needs one cycle to obtain the computing result immediately when the memory access ends, without waiting for multiple delay cycles, minimizing power consumption and waiting time.

In some embodiments of the present disclosure, the 8T SRAMs 21~24 may comprise eight-transistor dual-port static random access memories (8T Dual-port SRAMs). Each of the 8T DP-SRAMs has two word lines WL_A, WL_B and two bit lines BL_A, BL_B, which may be respectively connected to two processors, so that the two processors can control and operate them respectively. Therefore, the 8T DP-SRAM architecture can support parallel IMC functions.

Figure 3:
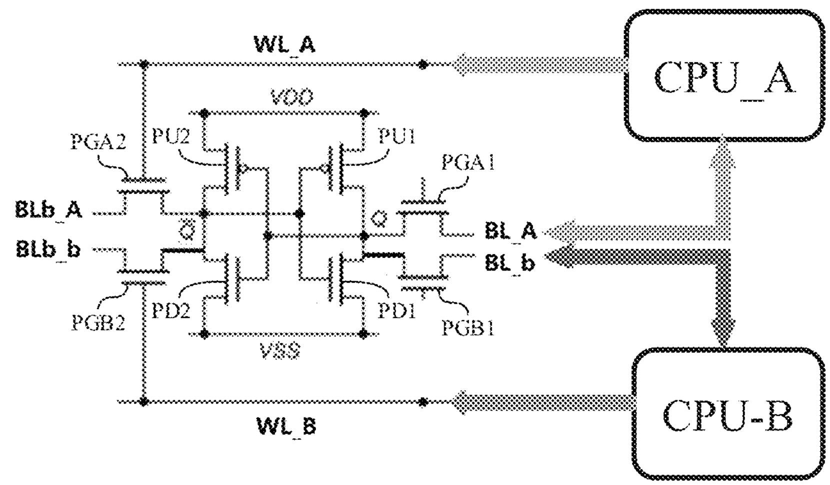
FIG. 3 shows a schematic diagram of parallel IMC using 8T dual-port SRAM according to some embodiments of the present disclosure.

Further referring to FIG. 3, FIG. 3 shows a schematic diagram of parallel IMC using 8T dual-port SRAM according to some embodiments of the present disclosure.

As shown in FIG. 3, in some embodiments of the present disclosure, the 8T DP-SRAM may comprise a first gate transistor PGA1, a second gate transistor PGA2, a third gate transistor PGB1, a fourth gate transistor PGB2, a first pull-up transistor PU1, a second pull-up transistor PU2, a first pull-down transistor PD1, and a second pull-down transistor PD2.

In some embodiments, a drain of the first gate transistor PGA1 may be connected to the first read/write port of the first group of read/write dual ports, for the first processor CPU_A to read data from the internal node Q, or write data into the internal node Q. A gate of the first gate transistor PGA1 may be connected to the row direction configuration port XC, for the direction configuration circuit to control whether there is a need to perform a logic operation on the value of the internal node Q of the 8T DP-SRAM. A source of the first gate transistor PGA1 may be connected to the internal node Q of the 8T DP-SRAM to lead out the internal node Q for data reading or data writing.

In some embodiments, a drain of the second gate transistor PGA2 may be connected to the second read/write port of the first group of read/write dual ports. A gate of the second gate transistor PGA2 may be connected to the first word line port, for the first processor CPU_A to control the on/off of the second gate transistor PGA2. A source of the second gate transistor PGA2 may be connected to the inverted internal node $Q^-$ of the 8T DP-SRAM to lead out the inverted internal node $Q^-$ for data reading or data writing.

In some embodiments, a drain of the third gate transistor PGB1 may be connected to the first read/write port of the second group of read/write dual ports, for the second processor CPU_B to read data from the internal node Q, or write data into the internal node Q.

A gate of the third gate transistor PGB1 may be connected to the column direction configuration port YC, for the direction configuration circuit to control whether there is a need to perform a logic operation on the value of the internal node Q of the 8T DP-SRAM. A source of the third gate transistor PGB1 may be connected to the internal node Q of the 8T DP-SRAM to lead out the internal node Q for data reading or data writing.

In some embodiments, a drain of the fourth gate transistor PGB2 may be connected to the second read/write port of the second group of read/write dual ports. A gate of the fourth gate transistor PGB2 may be connected to the second word line port, for the second processor CPU_B to control the on/off of the fourth gate transistor PGB2. A source of the fourth gate transistor PGB2 may be connected to the inverted internal node $Q^-$ of the 8T DP-SRAM to lead out the inverted internal node $Q^-$ for data reading or data writing.

In some embodiments, a source of the first pull-up transistor PU1 may be connected to a high-level internal working voltage VDD of the device. A drain of the first pull-up transistor PU1 may be connected to the internal node Q. A gate of the first pull-up transistor PU1 may be connected to the inverted internal node $Q^-$. In response to that the second bit line BLb_A or the fourth bit line BLb_B writes low-level data 0 to the inverted internal node $Q^-$, the first pull-up transistor PU1 may be turned on and pull the level of the internal node Q to high-level data 1.

In some embodiments, a source of the second pull-up transistor PU2 may also be connected to the high-level internal working voltage VDD. A drain of the second pull-up transistor PU2 may be connected to the inverted internal node $Q^-$. A gate of the second pull-up transistor PU2 may be connected to the internal node Q. In response to that the first bit line BL_A or the third bit line BL_B writes low-level data 0 to the internal node Q, the second pull-up transistor PU2 may be turned on and pull up the level of the inverted internal node $Q^-$ to high-level data 1.

In some embodiments, a source of the first pull-down transistor PD1 may be connected to a low-level common ground voltage VSS. A drain of the first pull-down transistor PD1 may be connected to the internal node Q. A gate of the first pull-down transistor PD1 may be connected to the inverted internal node $Q^-$. In response to that the second bit line BLb_A or the fourth bit line BLb_B writes high-level data 1 to the inverted internal node $Q^-$, the first pull-down transistor PD1 may be turned on and pull down the level of the internal node Q to low-level data 0.

In some embodiments, a source of the second pull-down transistor PD2 may also be connected to the low-level common ground voltage VSS. A drain of the second pull-down transistor PD2 may be connected to the inverted internal node $Q^-$. A gate of the second pull-down transistor PD2 may be connected to the internal node Q. In response to that the first bit line BL_A or the third bit line BL_B writes high-level data 1 to the internal node Q, the second pull-down transistor PD2 may be turned on and pull down the level of the inverted internal node $Q^-$ to low-level data 0.

It can be seen that the values of the internal node Q and the inverted internal node $Q^-$ in the 8T DP-SRAM must be inverse of each other. Correspondingly, the data of the first read/write port and the data of the second read/write port of each group of read/write dual ports must also be inverse of each other. That is, the data of the first bit line BL_A and the date of the second bit line BLb_A must be inverse of each other, and the data of the third bit line BL_B and the date of the fourth bit line BLb_B must also be inverse of each other.

The two processors CPU_A and CPU_B can perform data reading and writing on the internal node Q in the 8T DP-SRAM, respectively through the first read/write port of the first group of read/write dual ports and the first read/write port of the second group of read/write dual ports. In other words, the 8T DP-SRAM can support two processors, CPU_A and CPU_B, to simultaneously perform two read operations, one write and one read operations, or two write operations of same data in one cycle.

Figure 4:
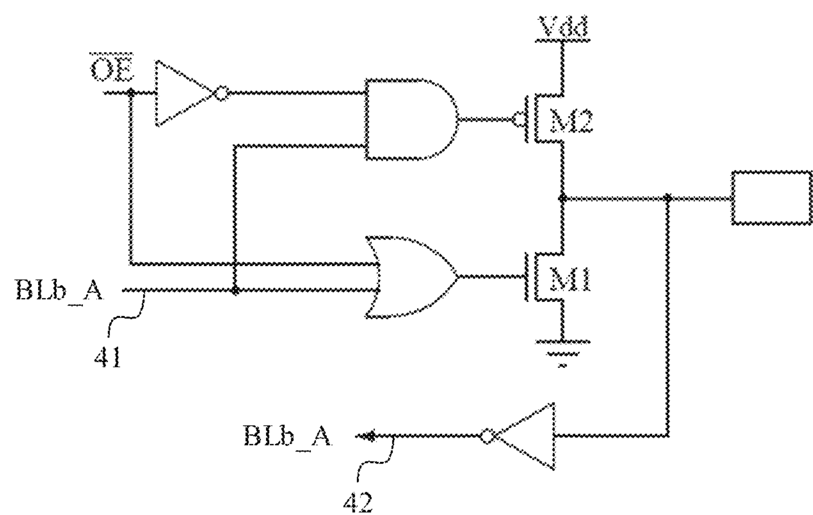
FIG. 4 shows a schematic diagram of the structure of a bidirectional I/O circuit according to some embodiments of the present disclosure.

Referring to FIG. 4, FIG. 4 shows a schematic diagram of the structure of a bidirectional I/O circuit according to some embodiments of the present disclosure.

As shown in FIG. 4, in some embodiments of the present disclosure, the bidirectional I/O circuit may comprise a read/write operation enable port $(OE)^{-}$, a write port 41 and a read port 42. The second bit line BLb_A may be respectively connected to the write port 41 and the read port 42 of the bidirectional I/O circuit, and is connected to the first processor CPU_A through the bidirectional I/O circuit. The first processor CPU_A can control the on/off of the write port 41 and the read port 42 by outputting an enable signal to the read/write operation enable port $(OE)^{-}$, performing read/write operations on each of the 8T SRAMs 21~24.

In one embodiment, in response to a need to perform a write operation on the second bit line BLb_A, the direction configuration circuit may first output a low-level voltage to the row direction configuration port XC of each of the 8T SRAMs 21~24 to cut off the connection between each internal node Q and the first processor CPU_A. At the same time, the first processor CPU_A may connect the first word line WL_A to a high-level voltage to achieve the connection between each inverted internal node $Q^{-}$ and the first processor CPU_A. After that, the first processor CPU_A may output a high-level signal to the read/write operation enable port $(OE)^{-}$ of the bidirectional I/O circuit. In response to the enable signal of $(OE)^{-}$=1, the bidirectional I/O circuit may turn off the transistors M1 and M2 to cut off the data provided by the read port 42. The first processor CPU_A may write data to the second bit line BLb_A through the write port 41.

In response to a need to perform a read operation on the second bit line BLb_A, the direction configuration circuit may output a low-level voltage to the row direction configuration port XC of each of the 8T SRAMs 21~24 to cut off the connection between each internal node Q and the first processor CPU_A. At the same time, the first processor CPU_A may connect the first word line WL_A to a high-level voltage to achieve the connection between each inverted internal node $Q^{-}$ and the first processor CPU_A. After that, the first processor CPU_A may output a low-level signal to the read/write operation enable port $(OE)^{-}$ of the bidirectional I/O circuit. In response to the enable signal of $(OE)^{-}$=0, the bidirectional I/O circuit may activate the transistors M1 and M2. The first processor CPU_A may read data from the second bit line BLb_A through the read port 42.

In other embodiments of the present disclosure, the fourth bit line BLb_B may be respectively connected to the write port 41 and the read port 42 of another bidirectional I/O circuit, and is connected to the second processor CPU_B through the another bidirectional I/O circuit. The second processor CPU_B can control the on/off of the write port 41 and the read port 42 by outputting an enable signal to the read/write operation enable port $(OE)^{-}$, performing read/write operations on each of the 8T SRAMs 21~24. The principle of the second processor CPU_B performing read/write operations on each of the 8T SRAMs 21~24 is same as that of the first processor CPU_A, and will not be repeated here.

Figure 5:
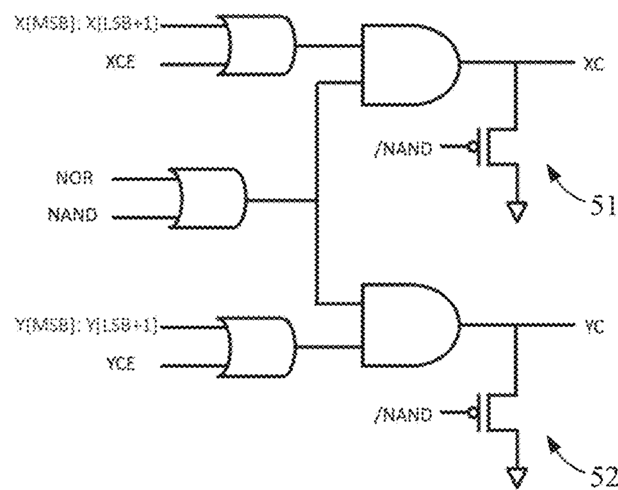
FIG. 5 shows a schematic diagram of the structure of a direction configuration circuit according to some embodiments of the present disclosure.

Referring to FIG. 5, FIG. 5 shows a schematic diagram of the structure of a direction configuration circuit according to some embodiments of the present disclosure.

As shown in FIG. 5, in some embodiments of the present disclosure, the direction configuration circuit may comprise a row direction enable port XCE, a column direction enable port YCE, and logic operation enable ports NOR and NAND. In some embodiments, the first processor CPU_A may output an enable signal (e.g. XCE=1) to the row direction enable port XCE, activating the row direction configuration port XC of each of the 8T SRAMs 21~24 to perform a cross-word logic operation. In some embodiments, the second processor CPU_B may output an enable signal to the column direction enable port YCE (e.g. YCE=1), activating the column direction configuration port YC of each of the 8T SRAMs 21~24 to perform a cross-bit logic operation.

Referring to FIG. 2 and FIG. 5 in combination, in some embodiments, in response to a need to perform a NAND logic operation on the values stored in the 8T SRAM 21 and the 8T SRAM 22 that are adjacent in the row direction, the first processor CPU_A may first precharge the first bit line BL_A to a high level. At the same time, the first processor CPU_A may output a high-level signal to the logic operation enable port NAND and the row direction enable port XCE, outputting a high-level voltage to the row direction configuration ports XC of the 8T SRAM 21 and 8T SRAM 22. At this time, the first gate transistors PGA1 of the 8T SRAM 21 and 8T SRAM 22 may be turned on in response to the high-level voltage of the row direction configuration ports XC, connecting their internal nodes Q1 and Q2 to the first bit line BL_A. The first processor CPU_A may determine the result of the NAND logic operation by monitoring the voltage level of the first bit line BL_A.

In some embodiments, if the value of the internal node Q1 of the 8T SRAM 21 and the value of the internal node Q2 of the 8T SRAM 22 are both 1, the voltage level of the first bit line BL_A will remain high. At this time, the first processor CPU_A may determine that the result of the NAND logic operation is 0. In some embodiments, if the value of the internal node Q1 of the 8T SRAM 21 and the value of the internal node Q2 of the 8T SRAM 22 are not both 1, the voltage level of the first bit line BL_A will be pulled down to a low level. At this time, the first processor CPU_A may determine that the result of the NAND logic operation is 1.

In some embodiments, based on the same principle, the first processor CPU_A may also determine that the result of a AND logic operation is 1 in response to the level of the first bit line BL_A remaining high, and determine that the result of the AND logic operation is 0 in response to a decrease in voltage level of the first bit line BL_A.

Correspondingly, in other embodiments, in response to a need to perform a NAND logic operation or an AND logic operation on the values stored in the 8T SRAM 21 and the 8T SRAM 23 that are adjacent in the column direction, the second processor CPU_B may first precharge the third bit line BL_B to a high level. At the same time, the second processor CPU_B may output a high-level signal to the logic operation enable port NAND and the column direction enable port YCE, outputting a high-level voltage to the column direction configuration ports YC of the 8T SRAM 21 and 8T SRAM 23. At this time, the third gate transistors PGB1 of the 8T SRAM 21 and the 8T SRAM 23 may be turned on in response to the high-level voltage of the column configuration ports YC, connecting their internal nodes Q1 and Q3 to the third bit line BL_B. The second processor CPU_B may determine the results of the NAND logic operation and the AND logic operation by monitoring the level of the third bit line BL_B. The specific judgment methods of the cross-bit NAND logic operation and the cross-bit AND logic operation are similar to the cross-word NAND logic operation and the cross-word AND logic operation described above, and will not be repeated here.

As shown in FIG. 5, in some embodiments of the present disclosure, the output terminal of the direction configuration circuit, connected to the row direction configuration port XC, can be grounded through the first transistor 51, and the output terminal of it, connected to the column direction configuration port YC, can be grounded through the second transistor 52.

Referring to FIG. 2 and FIG. 5 in combination, in some embodiments, in response to a need to perform a NOR logic operation on the values stored in the 8T SRAM 21 and the 8T SRAM 22 that are adjacent in the row direction, the first processor CPU_A may first precharge the first bit line BL_A to a high level, and output a high-level signal to the logic operation enable port NOR and the row direction enable port XCE, outputting a high-level voltage to the row direction configuration ports XC of the 8T SRAM 21 and the 8T SRAM 22. At the same time, the first processor CPU_A may further turn on the first transistor 51 to pull down the potential of the row configuration port XC. At this time, the potential of the row configuration port XC is lower than the internal voltage VDD of the device, and the first gate transistors PGA1 of the 8T SRAM 21 and the 8T SRAM 22 may not be completely turned on.

In the above case, only when the value of the internal node Q1 of the 8T SRAM 21 and the value of the internal node Q2 of the 8T SRAM 22 are both 0, the voltage level of the first bit line BL_A will be pulled down to a low level. Therefore, the first processor CPU_A can determine that the result of the NOR logic operation is 0 in response to the voltage level of the first bit line BL_A remaining high, and can also determine that the result of the NOR logic operation is 1 in response to a decrease in voltage level of the first bit line BL_A.

In some embodiments, based on the same principle, the first processor CPU_A may also determine that the result of an OR logic operation is 1 in response to the voltage level of the first bit line BL_A remaining high, and determine that the result of the OR logic operation is 0 in response to a decrease in voltage level of the first bit line BL_A.

Correspondingly, in other embodiments, in response to a need to perform a NOR logic operation or an OR logic operation on the values stored in the 8T SRAM 21 and the 8T SRAM 23 that are adjacent in the column direction, the second processor CPU_B may first precharge the third bit line BL_B to a high level, and output a high-level signal to the logic operation enable port NOR and the column direction enable port YCE, outputting a high-level voltage to the column direction configuration ports YC of the 8T SRAM 21 and the 8T SRAM 23. At the same time, the second processor CPU_B may further turn on the second transistor 52 to pull down the potential of the column configuration ports YC. At this time, the potential of the column configuration ports YC is lower than the internal voltage VDD of the device, and the third gate transistors PGB1 of the 8T SRAM 21 and the 8T SRAM 23 may not be completely turned on. The second processor CPU_B may determine the result of the NOR logic operation and the OR logic operation by monitoring the level of the third bit line BL_B. The specific judgment method of the cross-bit NOR logic operation and the OR logic operation is similar to the cross-word NOR logic operation and the OR logic operation described above, and will not be repeated here.

Figure 6:
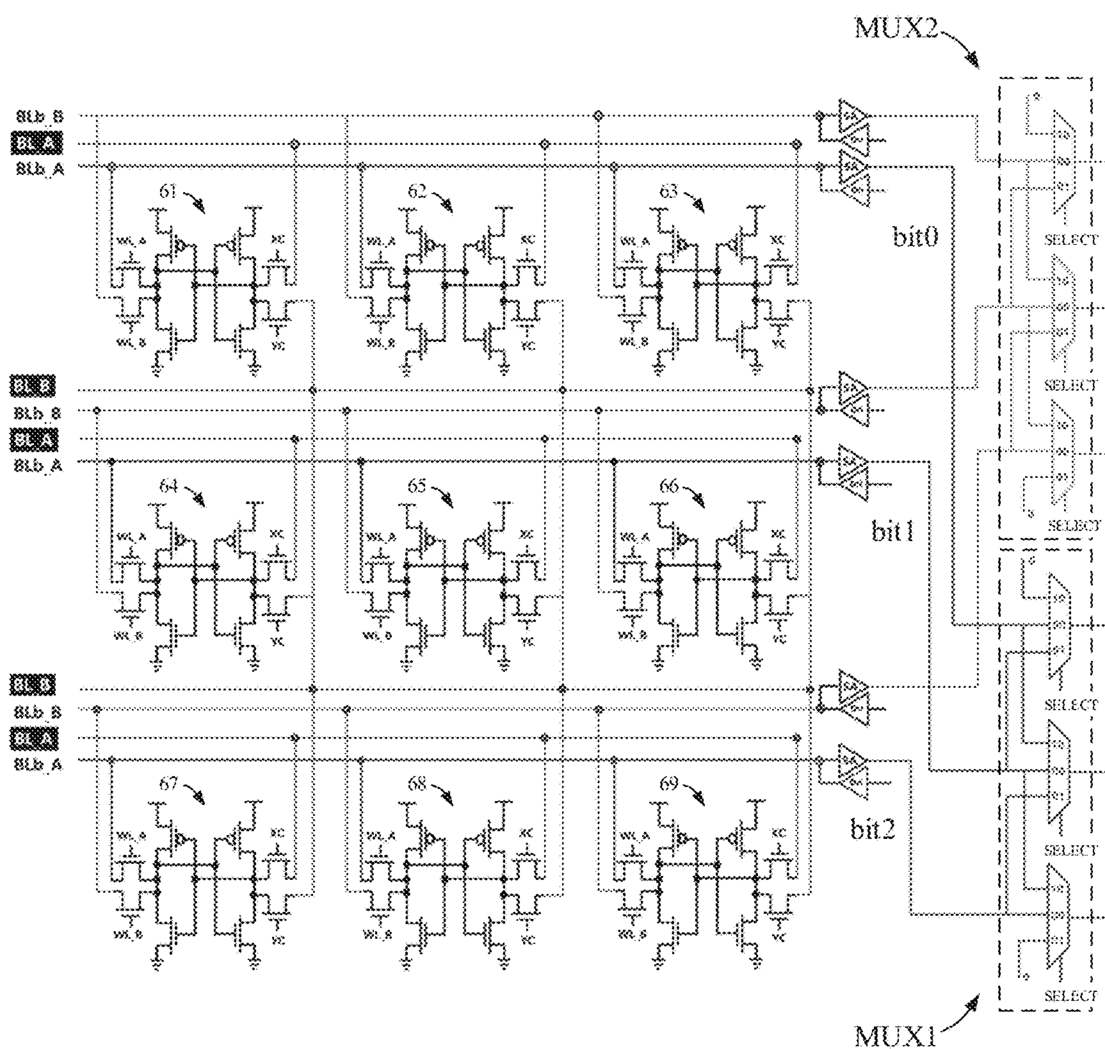
FIG. 6 shows a schematic diagram of a circuit for implementing data shift function according to some embodiments of the present disclosure.

Referring to FIG. 6, FIG. 6 shows a schematic diagram of a circuit for implementing a data shift function according to some embodiments of the present disclosure.

As shown in FIG. 6, in some embodiments of the present disclosure, the circuit structure for IMC may further comprise two selection modules MUX1 and MUX2, for performing a shift operation on the data stored in each of the 8T SRAMs 61~69 in the memory array. In some embodiments, the second bit line BLb_A may be connected to the first processor CPU_A through the first selection module MUX1, to perform a left/right shift operation on the data stored in each of the 8T SRAMs 61~69 under the control of the first processor CPU_A. The fourth bit line BLb_B may be connected to the second processor CPU_B through the second selection module MUX2, to perform a left/right shift operation on the data stored in each of the 8T SRAMs 61~69 under the control of the second processor CPU_B.

In some embodiments, the first selection module MUX1 and the second selection module MUX2 may respectively comprise a plurality of selection units. A number of selection units comprised in each selection module may correspond to the number of rows of the 8T SRAMs 61~69 in the memory array. In some embodiments, the selection unit may be an N to 1 multiplexer, and N corresponds to the number of input/output (I/O) data of the memory array. In this embodiment, the number of I/O data may be the number of the shift operations, that is, N=3.

In some embodiments, each selection unit may comprise a selection port SELECT and three input ports 00, 01, and 10, and each input port may correspond to a shift operation. In some embodiments, the input port 00 can correspond to a hold-in-place operation. In some embodiments, the input port 01 may correspond to a right shift operation. In some embodiments, the input port 10 may correspond to a left shift operation.

In some embodiments, the second bit line BLb_A of each row of the 8T SRAMs 61~69 may be respectively connected to the hold-in-place input port 00 of the selection unit in a same row, the right shift input port 01 of the selection unit in an above row, and the left shift input port 10 of the selection unit in a below row. In some embodiments, the fourth bit line BLb_B of each row of the 8T SRAMs 61~69 may be respectively connected to the hold-in-place input port 00 of the selection unit in a same row, the right shift input port 01 of the selection unit in an above row, and the left shift input port 10 of the selection unit in a below row. Each selection unit may turn on a corresponding input port to perform a hold-in-place operation, a left shift operation, or a right shift operation, according to the selection signal input by its own selection port SELECT.

The description will be given below in conjunction with an embodiment in which the first processor CPU_A controls the first selection module MUX1 to implement data shifting. Further referring to FIG. 7, FIG. 7 shows a schematic diagram of controlling a first selection module to perform data shifting by a first processor according to some embodiments of the present disclosure.

Figure 7:
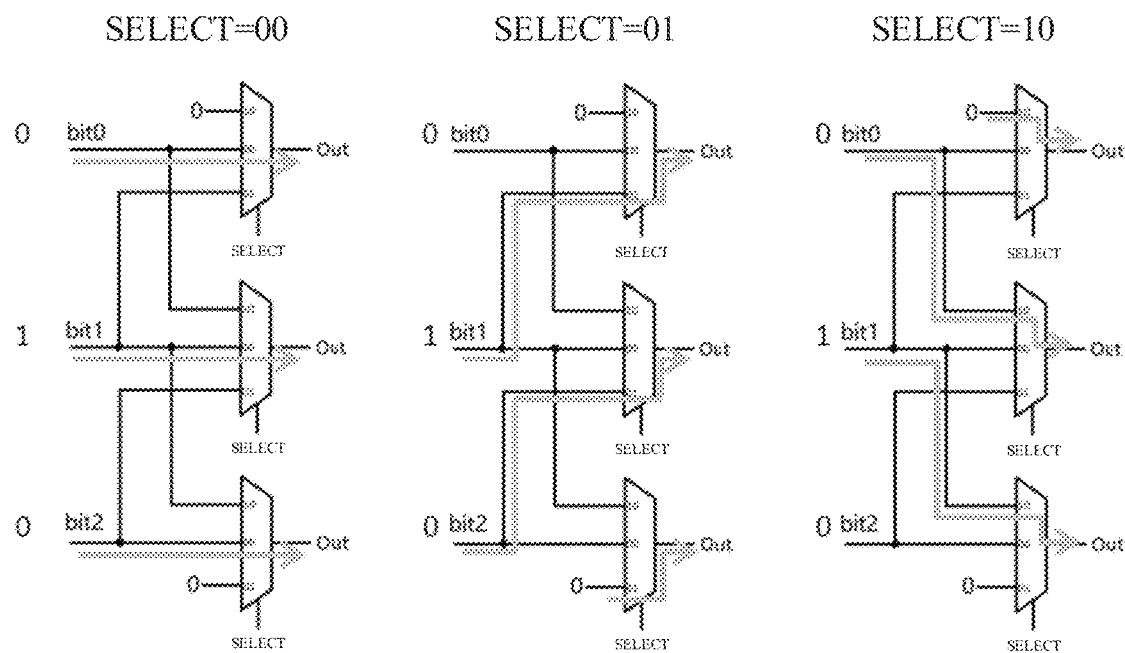
FIG. 7 shows a schematic diagram of controlling a first selection module to perform data shifting by a first processor according to some embodiments of the present disclosure.

As shown in FIG. 6 and FIG. 7, in some embodiments of the present disclosure, in response to a need to a right shift operation for data bit0 stored in the first row of 8T SRAMs 61~63, data bit1 stored in the second row of 8T SRAMs 64~66, and data bit3 stored in the third row of 8T SRAMs 67~69, the first processor CPU_A may input a selection signal of SELECT=01 to the selection port SELECT of each selection unit of the first selection module MUX1. In response to the selection signal of SELECT=01, each selection unit of the first selection module MUX1 may respectively turn on its right shift input port 01, shifting the data 010 originally stored in the memory array to right into 001, and sending it to the first processor CPU_A through the output terminal of the first selection module MUX1.

In some embodiments, the first processor CPU_A may also input a selection signal of SELECT=10 to the selection port SELECT of each selection unit of the first selection module MUX1 to perform a right shift operation. In some embodiments, the first processor CPU_A may also input a selection signal of SELECT=00 to the selection port SELECT of each selection unit of the first selection module MUX1 to perform a hold-in-place operation.

Based on the same principle, in some embodiments, the second processor CPU_B may input a selection signal of SELECT=01 to the selection port SELECT of each selection unit of the second selection module MUX2 to perform a left shift operation; input a selection signal of SELECT=10 to the selection port SELECT of each selection unit of the second selection module MUX2 to perform a right shift operation; input a selection signal of SELECT=00 to the selection port SELECT of each selection unit of the second selection module MUX2 to perform a hold-in-place operation.

In some embodiments of the present disclosure, the circuit structure for IMC may further comprise a transition detection circuit, which is used to implement the function of comparing internal data Q of a binary content address memory BCAM with external data SL.

Figure 8:
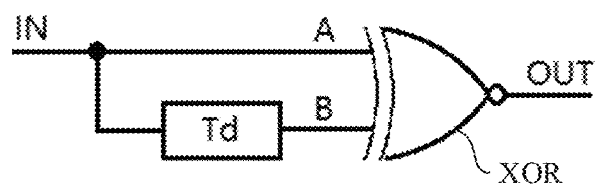
FIG. 8 shows a schematic diagram of a transition detection circuit according to some embodiments of the present disclosure.
Figure 9:
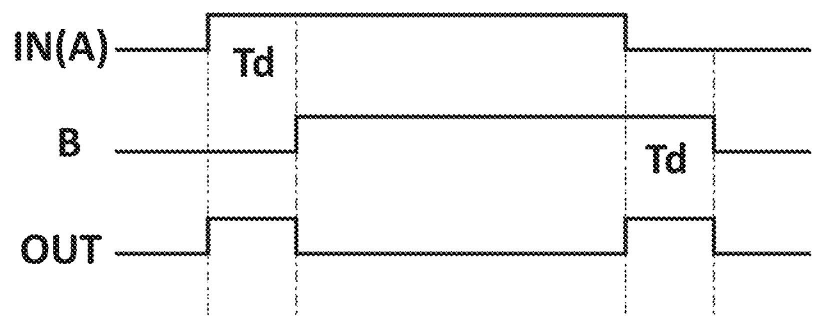
FIG. 9 shows a timing diagram of a transition detection circuit according to some embodiments of the present disclosure.

Referring to FIG. 8 and FIG. 9 in combination, FIG. 8 shows a schematic diagram of a transition detection circuit according to some embodiments of the present disclosure. FIG. 9 shows a timing diagram of a transition detection circuit according to some embodiments of the present disclosure.

As shown in FIG. 8 and FIG. 9, in some embodiments of the present disclosure, the transition detection circuit may comprise a delay module Td and a XOR logic module. In some embodiments, the delay module Td may delay an input signal A for a duration of Td to generate a delayed signal B. In response to a change in voltage level of the input terminal IN, the input signal A may be different from the delayed signal B, so that a pulse wave with a pulse width of Td is output at the output terminal OUT of the transition detection circuit.

In some embodiments, the first bit line BL_A may be connected to the external data SL and connected to the input terminal IN of the transition detection circuit, to connect to the first processor CPU_A through the transition detection circuit. The first processor CPU_A may determine the comparison result of the internal data Q and the external data SL by monitoring the voltage level change of the output terminal OUT of the transition detection circuit.

In some embodiments, in response to a need to compare the internal data Q, stored in any one of the 8T SRAMs, with the external data SL, connected to the first bit line BL_A, the first processor CPU_A may output an enable signal to the row direction enable port XCE, outputting a high-level voltage to the row direction configuration port XC of a corresponding 8T SRAM to turn on the first gate transistor PGA1 of the 8T SRAM.

In some embodiments, if the internal data Q stored in the 8T SRAM is consistent with the external data SL connected to the first bit line BL_A, the input terminal IN of the transition detection circuit may not change in voltage level. The output terminal OUT of the transition detection circuit may not output a pulse wave. In response to no change in voltage level output by the transition detection circuit, the first processor CPU_A may determine that the internal data Q stored in the 8T SRAM is same as the external data SL connected to the first bit line BL_A.

In some embodiments, if the internal data Q stored in the 8T SRAM is different from the external data SL connected to the first bit line BL_A, the input terminal IN of the transition detection circuit may have a voltage level change. The output terminal OUT of the transition detection circuit may output a pulse wave with a pulse width of Td. In response to the pulse wave with a pulse width of Td output by the transition detection circuit, the first processor CPU_A may determine that the internal data Q stored in the 8T SRAM is different from the external data SL connected to the first bit line BL_A.

In other embodiments, the third bit line BL_B may be connected to the external data SL and connected to the input terminal IN of another transition detection circuit, connecting the second processor CPU_B through the transition detection circuit. The second processor CPU_B may determine the comparison result of the internal data Q and the external data SL by monitoring the voltage level change of the output terminal OUT of the transition detection circuit. The principle of determining whether the internal data Q stored in the 8T SRAM is same as the external data SL connected to the first bit line BL_A, by the second processor CPU_B, is basically the same as that of the first processor CPU_A, and will not be repeated here.

Based on the above description, the circuit structure for IMC provided by the present disclosure has a simplified manufacturing process and design, and provides the function of parallel IMC. In some embodiments, the above-mentioned configurable circuit structure may perform cross-word logic operations and cross-bit logic operations, and provide Shift and BCAM functions, further expanding the functions of the memory array.

In some embodiments, signals and data can be represented using any of a variety of different technologies and techniques. For example, the data, instructions, commands, information, signals, bits, symbols and chips cited throughout the above description can be expressed by voltage, current, electromagnetic waves, magnetic fields or magnetic particles, light fields or optical particles, or any combination of them.

In some embodiments, the various illustrative logic blocks, modules, circuits and algorithm steps described in conjunction with the embodiments disclosed herein can be implemented as electronic hardware, computer software, or a combination of the two. In order to clearly explain the interchange ability of hardware and software, various illustrative components, blocks, modules, circuits, and steps are generally described above in terms of their functionality. Whether such functionality is implemented as hardware or software depends on the specific application and the design constraints imposed on the overall system. Technicians can implement the described functionality in different ways for each specific application, but such implementation decisions should not be interpreted as causing a departure from the scope of the present disclosure.

The various illustrative logic modules and circuits described in conjunction with the embodiments disclosed herein can be general-purpose processors, digital signal processors (DSP), application-specific integrated circuits (ASIC), field programmable gate arrays (FPGA) or other programmable logic devices, discrete gate or transistor logic, discrete hardware components, or any combination thereof designed to perform the functions described herein are implemented or executed. A general-purpose processor may be a microprocessor, but in the alternative, the processor may be any conventional processor, controller, microcontroller, or state machine. The processor may also be implemented as a combination of computing devices, such as a combination of a DSP and a microprocessor, multiple microprocessors, one or more microprocessors in cooperation with a DSP core, or any other such configuration.

The steps of the method or algorithm described in conjunction with the embodiments disclosed herein may be directly embodied in hardware, in a software module executed by a processor, or in a combination of the two. The software module may reside in RAM memory, flash memory, ROM memory, EPROM memory, EEPROM memory, registers, hard disk, removable disk, CD-ROM, or any other form of storage medium known in the art. An exemplary storage medium is coupled to the processor and the processor can read information from and write information to the storage medium. In another embodiment, the storage medium may be integrated into the processor. The processor and the storage medium may reside in the ASIC. The ASIC may reside in the user terminal. In the another embodiment, the processor and the storage medium may reside as discrete components in the user terminal.

In one or more exemplary embodiments, the functions described may be implemented in hardware, software, firmware, or any combination thereof. If implemented as a computer program product in software, each function can be stored as one or more instructions or codes on a computer-readable medium or transmitted through it. Computer-readable media includes both computer storage media and communication media, including any medium that facilitates the transfer of a computer program from one place to another. The storage medium may be any available medium that can be accessed by a computer. By way of example and not limitation, such computer-readable media may include RAM, ROM, EEPROM, CD-ROM or other optical disk storage, magnetic disk storage or other magnetic storage devices, or any other medium that can be used to carry or store desired program codes in the form of instructions or data structures and that can be accessed by a computer. Any connection is also properly called a computer-readable medium. For example, if the software is transmitted from a web site, server, or other remote source using coaxial cable, fiber optic cable, twisted pair, digital subscriber line (DSL), or wireless technology such as infrared, radio, and microwave, then the coaxial cable, fibre optic cable, twisted pair, DSL, or wireless technologies such as infrared, radio, and microwave are included in the definition of the medium. Disks and discs as used in this article include compact discs (CDs), laser discs, optical discs, digital versatile discs (DVD), floppy disks and Blu-ray discs, among which disks are often reproduced in a magnetic manner Data, and a disc optically reproduces the data with a laser. Combinations of the above should also be included in the scope of computer-readable media.

What is claimed is:

1. A circuit structure for in-memory computing, comprising:

a plurality of eight-transistor SRAMs, wherein each of the eight-transistor SRAMs comprises two groups of read/write dual ports, two word line ports and two direction configuration ports, wherein data of a first read/write port and data of a second read/write port of each group of the read/write dual ports are inverse of each other;

a first bit line, connected to a first processor, and connected to the first read/write port of a first group of read/write dual ports of each eight-transistor SRAM in a row direction;

a second bit line, connected to the second read/write port of the first group of read/write dual ports of each eight-transistor SRAM in the row direction;

a third bit line, connected to a second processor, and connected to the first read/write port of a second group of read/write dual ports of each eight-transistor SRAM;

a fourth bit line, connected to the second read/write port of the second group of read/write dual ports of each eight-transistor SRAM in the row direction;

a first word line, connected to the first processor, and connected to a first word line port of each eight-transistor SRAM;

a second word line, connected to the second processor, and connected to a second word line port of each eight-transistor SRAM; and a direction configuration circuit, connected to each direction configuration ports of each eight-transistor SRAM, configured to activate any one of the direction configuration ports of each eight-transistor SRAM to perform a logic operation on the eight-transistor SRAMs in a corresponding direction.

2. The circuit structure of claim 1, wherein the eight-transistor SRAM comprises:

a first gate transistor, wherein a drain of the first gate transistor is connected to the first read/write port of the first group of read/write dual ports, a gate of the first gate transistor is connected to a row direction configuration port, and a source of the first gate transistor is connected to an internal node of the eight-transistor SRAM;

a second gate transistor, wherein a drain of the second gate transistor is connected to the second read/write port of the first group of read/write dual ports, a gate of the second gate transistor is connected to the first word line port, and a source of the second gate transistor is connected to an inverted internal node of the eight-transistor SRAM;

a third gate transistor, wherein a drain of the third gate transistor is connected to the first read/write port of the second group of read/write dual ports, a gate of the third gate transistor is connected to a column direction configuration port, and a source of the third gate transistor is connected to the internal node of the eight-transistor SRAM;

a fourth gate transistor, wherein a drain of the fourth gate transistor is connected to the second read/write port of the second group of read/write dual ports, a gate of the fourth gate transistor is connected to the second word line port, a source of the fourth gate transistor is connected to the inverted internal node of the eight-transistor SRAM;

a first pull-up transistor, wherein a source of the first pull-up transistor is connected to a high-level voltage, a drain of the first pull-up transistor is connected to the internal node, and a gate of the first pull-up transistor is connected to the inverted internal node;

a second pull-up transistor, wherein a source of the second pull-up transistor is connected to the high-level voltage, a drain of the second pull-up transistor is connected to the inverted internal node, and a gate of the second pull-up transistor is connected to the internal node;

a first pull-down transistor, wherein a source of the first pull-down transistor is connected to a low-level voltage, a drain of the first pull-down transistor is connected to the internal node, and a gate of the first pull-down transistor is connected to the inverted internal node; and a second pull-down transistor, wherein a source of the second pull-down transistor is connected to the low-level voltage, a drain of the second pull-down transistor is connected to the inverted internal node, and a gate of the second pull-down transistor is connected to the internal node.

3. The circuit structure of claim 1, wherein the second bit line is connected to the first processor through a write port of a bidirectional I/O circuit, and the fourth bit line is connected to the second processor through a write port of another bidirectional I/O circuit, in response to a need to perform a write operation on the second bit line or the fourth bit line, the direction configuration circuit outputs a low-level voltage to each direction configuration port of each eight-transistor SRAM, a corresponding word line is connected to a high-level voltage, and the write port of a corresponding bidirectional I/O circuit is turned on for a corresponding processor to write data to the second bit line or the fourth bit line.

4. The circuit structure of claim 3, wherein the second bit line is further connected to the first processor through a read port of the bidirectional I/O circuit, and the fourth bit line is further connected to the second processor through a read port of the another bidirectional I/O circuit, in response to a need to perform a read operation on the second bit line or the fourth bit line, the direction configuration circuit outputs a low-level voltage to each direction configuration port of each eight-transistor SRAM, a corresponding word line is connected to a high-level voltage, and the read port of a corresponding bidirectional I/O circuit is turned on for a corresponding processor to read data from the second bit line or the fourth bit line.

5. The circuit structure of claim 1, wherein the direction configuration circuit comprises a row direction enable port, a column direction enable port and a logic operation enable port, and the direction configuration circuit is configured to:

in response to high-level signals of the logic operation enable port and the row direction enable port, output a high-level voltage to a row direction configuration port of each eight-transistor SRAM to perform a logic operation on values of the eight-transistor SRAMs that are adjacent in the row direction; or in response to the high-level signals of the logic operation enable port and the column direction enable port, output a high-level voltage to a column direction configuration port of each eight-transistor SRAM to perform a logic operation on values of the eight-transistor SRAMs that are adjacent in the column direction.

6. The circuit structure of claim 5, wherein the first processor is configured to:

in response to a need to perform a NAND logic operation on the values of the eight-transistor SRAMs that are adjacent in the row direction, pre-charge the first bit line to a high level, and output a high-level signal to the logic operation enable port and the row direction enable port;

in response to the first bit line remaining in the high level, determine that result of the NAND logic operation is 0; and in response to the first bit line decreasing to a low level, determine that the result of the NAND logic operation is 1, the second processor is configured to:

in response to a need to perform a NAND logic operation on the values of the eight-transistor SRAMs that are adjacent in the column direction, pre-charge the third bit line to a high level, and output a high-level signal to the logic operation enable port and the column direction enable port;

in response to the third bit line remaining in the high level, determine that result of the NAND logic operation is 0; and in response to the third bit line decreasing to a low level, determine that the result of the NAND logic operation is 1.

7. The circuit structure of claim 5, wherein the row direction configuration port of each eight-transistor SRAM is grounded through a first transistor, and the column direction configuration port of each eight-transistor SRAM is grounded through a second transistor, wherein the first processor is configured to:

in response to a need to perform a NOR logic operation on the values of the eight-transistor SRAMs that are adjacent in the row direction, pre-charge the first bit line to a high level, turn on the first transistor to pull down a potential of the row direction configuration port, and output a high-level signal to the logic operation enable port and the row direction enable port;

in response to the first bit line remaining in the high level, determine that result of the NOR logic operation is 0; and in response to the first bit line decreasing to a low level, determine that the result of the NOR logic operation is 1, the second processor is configured to:

in response to a need to perform a NOR logic operation on the values of the eight-transistor SRAMs that are adjacent in the column direction, pre-charge the third bit line to a high level, turn on the second transistor to pull down a potential of the column direction configuration port, and output a high-level signal to the logic operation enable port and the column direction enable port;

in response to the third bit line remaining in the high level, determine that result of the NOR logic operation is 0; and in response to the third bit line decreasing to a low level, determining that the result of the NOR logic operation is 1.

8. The circuit structure of claim 1, further comprising two selection modules, wherein the second bit line is connected to the first processor through a first selection module, and the fourth bit line is connected to the second processor through the second selection module, and the two selection modules are configured to perform a hold-in-place operation, a left shift operation, or a right shift operation on value of each eight-transistor SRAM in response to an input selection signal.

9. The circuit structure of claim 8, wherein each of the selection modules comprises a plurality of selection units, a number of the selection units corresponds to a number of rows of the eight-transistor SRAMs, wherein each selection unit comprises one selection port and three input ports, each of the input ports corresponds to an operation, wherein bit lines of the eight-transistor SRAMs in each row are respectively connected to a hold-in-place input port of the selection unit in a same row, a right shift input port of the selection unit in an above row, and a left shift input port of the selection unit in a below row, each of the selection units of the selection module turns on a corresponding input port to perform the hold-in-place operation, the left shift operation, or the right shift operation according to the selection signal input from the selection port.

10. The circuit structure of claim 1, further comprising a transition detection circuit, the transition detection circuit is configured to output a pulse wave in response to a change in voltage level of an input terminal, the first processor is configured to:

in response to a need to compare value of the eight-transistor SRAM with external data, use the first bit line as the external data and connect the first bit line to the input terminal of the transition detection circuit;

turn on a row direction configuration port of the eight-transistor SRAM;

in response to no change in the voltage level output by the transition detection circuit, determine that the value of the eight-transistor SRAM is same as the external data; and in response to the pulse wave output by the transition detection circuit, determine that the value of the eight-transistor SRAM is different from the external data, the second processor is configured to:

in response to a need to compare value of the eight-transistor SRAM with external data, use the third bit line as the external data and connect the third bit line to the input terminal of the transition detection circuit;

turn on a column direction configuration port of the eight-transistor SRAM;

in response to no change in the voltage level output by the transition detection circuit, determine that the value of the eight-transistor SRAM is same as the external data; and in response to the pulse wave output by the transition detection circuit, determine that the value of the eight-transistor SRAM is different from the external data.

* * * * *